(12) United States Patent
Mazumder et al.

(10) Patent No.: US 10,606,512 B2
(45) Date of Patent: Mar. 31, 2020

(54) ON-DIE TERMINATION ARCHITECTURE

(71) Applicant: Micron Technology, Inc., Boise, ID (US)

(72) Inventors: Kallol Mazumder, Plano, TX (US); Myung-Ho Bae, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 15/790,896

(22) Filed: Oct. 23, 2017

(65) Prior Publication Data

US 2019/0121577 A1   Apr. 25, 2019

(51) Int. Cl.
| | |
|---|---|
| G06F 3/00 | (2006.01) |
| G06F 3/06 | (2006.01) |
| G11C 29/02 | (2006.01) |
| G11C 11/4076 | (2006.01) |
| G11C 7/22 | (2006.01) |
| G11C 11/419 | (2006.01) |

(52) U.S. Cl.
CPC .......... *G06F 3/0659* (2013.01); *G06F 3/0611* (2013.01); *G06F 3/0673* (2013.01); *G11C 7/222* (2013.01); *G11C 11/4076* (2013.01); *G11C 29/023* (2013.01); *G11C 29/028* (2013.01); *G11C 11/419* (2013.01)

(58) Field of Classification Search
None
See application file for complete search history.

(56) References Cited

U.S. PATENT DOCUMENTS

| | | | |
|---|---|---|---|
| 7,516,281 | B2 | 4/2009 | Laberge |
| 8,963,597 | B1 | 2/2015 | Mazumder |
| 2015/0228317 | A1 | 8/2015 | Mazumder et al. |
| 2015/0309529 | A1 | 10/2015 | Woo et al. |
| 2017/0133070 | A1 | 5/2017 | Ware et al. |

OTHER PUBLICATIONS

International Search Report for PCT Application No. PCT/US2018/039812 dated Oct. 12, 2018; 13 Pages.

*Primary Examiner* — Midys Rojas
(74) *Attorney, Agent, or Firm* — Fletcher Yoder, P.C.

(57) ABSTRACT

Methods and devices that receive commands at a command interface and uses control circuitry configured to implement the command. A routing pipeline is configured to translate and route the command from the command interface to the control circuitry. The routing pipeline includes clock circuitry. The clock circuitry includes a clock delay line and multiple cloned delay lines derived from the clock delay line. Each of the cloned delay lines are dedicated to a command type of multiple command types. The routing pipeline also includes delay circuitry configured to utilize the cloned delay lines to shift a data pin signal of the semiconductor device or shift a data strobe pin signal of the semiconductor device.

26 Claims, 8 Drawing Sheets

ON-DIE TERMINATION ARCHITECTURE

BACKGROUND

Field of the Present Disclosure

Embodiments of the present disclosure relate generally to the field of semiconductor devices. More specifically, embodiments of the present disclosure relate to architecture to provide independent control of on-die termination (ODT), such as RTT signals.

Description of Related Art

A semiconductor device, such as a microcomputer, memory, gate array, among others, may utilize on-die termination (ODT). Activation of the ODT may interfere with some operations (e.g., a memory READ) but may enhance other operations (e.g., a memory WRITE). Thus, the ODT may be dynamically activated using one or more signals, RTT, that is asserted based on various factors. For example, RTT may include one of four types: 1) RTT-PARK a non-command-based that occurs at any time enabled in a mode-register, 2) Dynamic RTT that occurs with a WRITE command, 3) WR-Nominal-RTT that occurs with a non-target WRITE command, and 4) RD-Nominal-RTT that occurs with a non-target READ command. All of these modes can produce ODT at a data pin (DQ). For a READ operation, all of these types of RTT may be disabled during the read-burst to prevent causing a conflict at the DQ. In some embodiments, there may be a priority list that determines which type of RTT has precedence overall and/or in certain conditions. For example, in some embodiments, RTT-PARK may have the lowest priority while an RTT-OFF (ODT disable) during a READ has the highest priority.

In some embodiments of a memory device, the RTT signal may be asserted to create a dynamic RTT window based on a CAS-write-latency (CWL), a CAS latency (CL), a burst-length of data, a write preamble, and/or latency-independent. CL is the column access strobe latency that is the delay time between when a memory controller tells the memory module to access a particular memory column and when the data in the given array location is available. Moreover, the CWL is a period of time from when a WRITE command is asserted to the input of the first data in a number of clock cycles. However, this timing may be very rigid to prevent the dynamic RTT window from being active during other operations (e.g., READ operation) that may be negatively effected by RTT being active.

Embodiments of the present disclosure may be directed to one or more of the problems set forth above.

BRIEF DESCRIPTION OF DRAWINGS

FIG. 3 is a timing diagram that includes separate non-ODT pulses for DQ and DQS to enable the DQ and/or DQS signals to be shifted independently of each other, according to an embodiment of the present disclosure;

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, an on-die termination (ODT) may be dynamically asserted during a first operation (e.g., WRITE operation) and deasserted during a second operation (e.g., READ operation). However, this ODT termination may be shifted relative to the first operation and a default ODT assertion command (e.g., RTT) to provide timing flexibility or enhance certain implementation aspects. To enable shifts in both forward and backward directions, a delay pipeline may delay a total number of shifts in both directions with a default "unshifted" command being delayed by a maximum number of shifts in the "backward direction." In other words, by delaying the default command, earlier commands are "shifted backwards" relative to the default command. The shifted default commands may be used for their rising or falling edges. Two shifted commands may then be combined to utilize independent rising and falling edges to enable shifting of edges of the ODT assertion command independently. As long as the two shifted commands overlap, a simple OR gate may be used to generate a stretched and shifted command.

To support flexibility in independently shifting RTT for DQ, shifting RTT for DQS, and offsetting DQS relative to DQ, a support architecture in the pipeline for routing DQ/DQS/RTT signals may be adjusted. For example, multiple cloned delay lines may be used to transfer a command (e.g., READ) into a DLL domain. Furthermore, independent DLL traces may be used to separately send control signals for READ, RTT, and/or RTT-disable signals during an operation (e.g., READ) to provide the additional flexibility used in shifting RTT for DQ, shifting RTT for DQS, and offsetting DQS relative to DQ. Furthermore, by using the described cloned delay lines and independent traces, the pipeline provides flexible control while avoiding timing conflicts.

Figure 1:
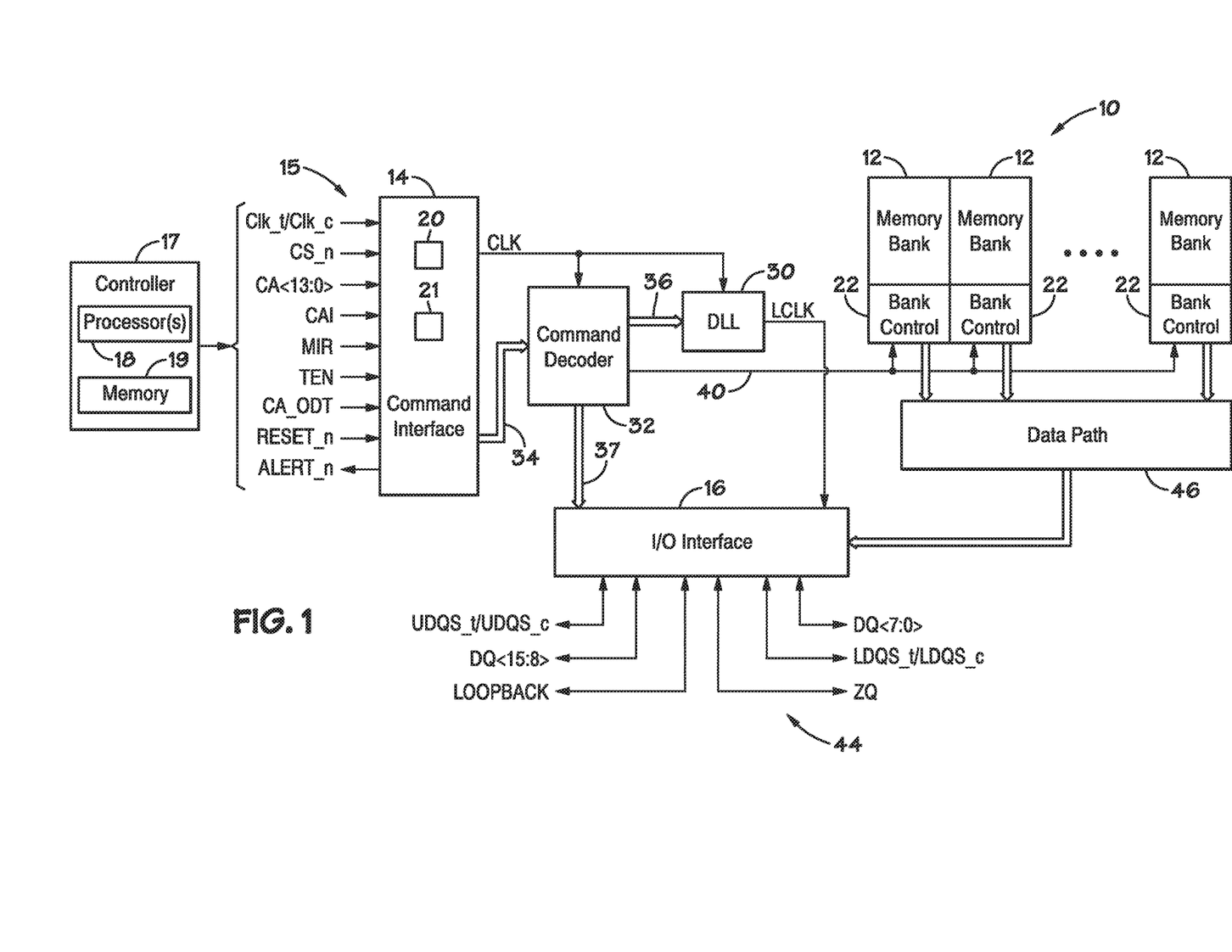
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to receive and provide a number of signals (e.g., signals 15) from an external device, such as controller 17 or a processor. The controller 17 may include a memory 19 and a processor 18. The processor or controller may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., READ command, WRITE command, etc.) are typically entered on the positive edges of the clock signal and data is transmitted or received on both the positive and negative clock edges.

The clock input circuit 20 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as READ commands, WRITE commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as READ commands and WRITE commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 21 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a WRITE command) or by the memory device 10 (e.g., for a READ command). For READ commands, the DQS signals are effectively additional data output (DQ) signals with a predetermined pattern. For WRITE commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/WRITE operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
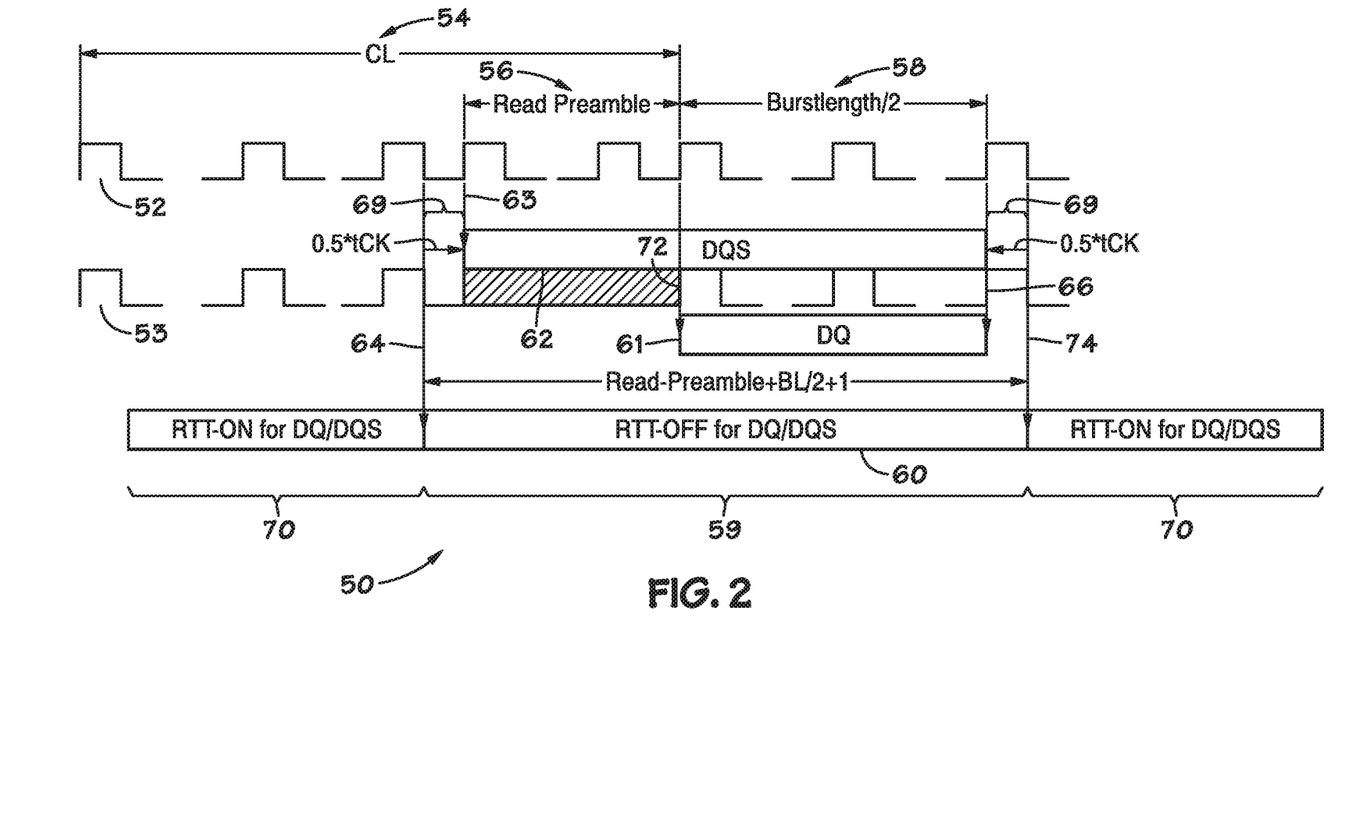
FIG. 2 is a timing diagram indicating a relationship between a non-ODT window and a clock signal, according to an embodiment of the present disclosure.

FIG. 2 illustrates a timing diagram 50 indicating a relationship between a non-ODT window and a clock signal 52 (e.g., Clk_t/Clk_c) and a data strobe (DQS) signal 53 (e.g., UDQS_t/UDQS_c, LDQS_t/LDQS_c). For a WRITE command, a memory controller 17 drives both DATA (i.e., DQ) as well as the DQS signal 53. The data is "strobed in" to memory device 10. During a READ operation, the memory device 10 drives the DATA on the DQ and toggles the DQS signal 53 as well. The memory device 10 aligns both the DQ as well as the DQS signal 53 to the external CLK using DLL. The DQS toggle for the READ is associated with a read preamble 56 that can have a different shape based on the read preamble cycle's setting in the mode-register. During the data-burst (i.e., when DQ starts to drive) the shape of DQS signal 53 looks like a clock. In other words, during the data-burst, the DQS signal 53 has a regular high/low pulse train.

As previously discussed, a delay occurs between a READ command and the first reading of the data. This delay is referred to as the CL 54. The CL 54 may be defined in the number of clock cycles of the clock signal 52. The DQS signal 53 is used to "strobe" the data. In some embodiments, prior to data arrival, the DQS signal 53 may behave differently than the clock signal 52. For example, the shape of the DQS signal 53 may appear differently than the pulse train occurring on the clock signal 52. This period may be referred to as a read-preamble that exists on the DQS signal 53. The specific shape may depend on the value on the read preamble cycles (e.g., 1, 2 or 3). The specific shape, along with CL information, aids in identifying an exact time of delivery of the read data.

As part of the CL 54, incoming data to be read as part of the READ command may include a read preamble 56. The actual data is read in a read period 58. In the illustrated embodiment, the read period 58 is the burst length divided by two. The read period 58 in this case is the burst length divided by two because the data is being written at a double data rate meaning that the data is read from memory on both falling edges and rising edges of clock signal 52. The burst length is the amount of data that may be read from memory in a single column access (e.g., a length of a prefetch that based on register size and/or number of registers).

As previously discussed, a READ operation may be inhibited by ODT during the READ operation. Non-ODT periods may be asserted during the READ operation using an RTT signal that is de-asserted during the READ operation. Specifically, if the mode registers indicate that an appropriate RTT (e.g., RTT-WR) is enabled, dynamic RTT occurs with every WRITE command. Similarly, if another RTT mode is set (e.g., RTT-NOM-WR/RTT-NOM-RD), non-target writes and/or reads result in ODT at the DQ. In some embodiments, this assertion of the RTT signal may instead de-assert ODT. A READ operation 59 may be defined as a combination of the read preamble 56 and the read period 58. Accordingly, an RTT-OFF signal 60 may occur during the READ operation 59 to disable ODT to ensure that the READ operation is performed properly. To ensure accuracy of reading during the READ operation 59, the RTT-OFF signal 60 (and the READ operation 59) may extend at least a portion of a clock period (tCK) before and after actual reading during the operation. The READ operation 59 includes a DQ signal 61 and a DQS signal 62. The DQ signal 61 may be actual data being read at a DQ pin of the memory device 10. The DQS signal 62 may be a data strobe that may be provided on a DQS pin of the memory device 10 to be used to ensure that the data on the DQ pin of the memory device 10 is captured properly.

In the illustrated embodiment, a DQS start 63 of a DQS signal 62 occurs half of tCK of the clock signal 52 after a RTT-OFF start 64, and a DQS end 66 occurs half of tCK of the clock signal 52 prior to an RTT-OFF end 68. In other words, the READ operation 59 includes buffers 69 that allow parameters to settle between operations. In other embodiments, the difference between the start/end of the DQS signal 62 and the start/end of the RTT-OFF signal 60 may be a whole (or any other portion of a whole) tCK of the clock signal 52. As illustrated, the RTT-OFF signal 60 may have a length that is equal to a sum of the length of the read preamble 56 and the read period 58 and the clock periods between start/end of the WRITE operation and the start/end of the RTT-OFF signal 60 (i.e., RTT signal 60=preamble+burst length/2+0.5 tCK+0.5tCK=preamble+burst length/2+1 tCK).

In some embodiments, the READ operation 59 may be expanded by shifting the on-edge (RTT-OFF start 64) or the off-edge (RTT-OFF end 68) to the time that is earlier than the READ operation 59 or later than the READ operation 59, respectively. This flexibility in the timing of ODT, enables a user to more finely tune the timing of the memory device 10 to specific applications. The RTT-OFF start 64 and the RTT-OFF end 68 may be shifted independently. In some embodiments, the direction of shift for each of the edges may be limited to a single direction to ensure that the RTT-OFF signal 60 occurs while the READ operation occurs. For example, the RTT-OFF start 64 may only be shifted earlier in time while the RTT-OFF end 68 may only be shifted later in time. In some embodiments, the length of the shift may also be limited to ensure that the RTT-OFF signal 60 does not extend into an adjacent WRITE operation 70 in which ODT may increase accuracy of the WRITE operation. In the following discussion, shifting of the RTT-OFF start 64 and the RTT-OFF end 68 are limited to two clock periods of the clock signal 52. However, in other embodiments, limitations on the shifts may be different based on the edge being shifted and/or may include different shift numbers other than one and two. In some embodiments, the size of the shift may be limited by a maximum number capable of being represented in a mode register to indicate the shift.

As previously noted, the DQ signal 61 may occur during the READ operation 59 when target data is being read during the read period 58. The DQ signal 61 includes a DQ start 72 when reading data via the DQ pin begins and a DQ end that corresponds to DQS end 66 when reading data via the DQ pin ends.

FIG. 3 illustrates a timing diagram 78 that includes separate RTT pulses for DQ and DQS to enable the DQ signal 61 and/or DQS signal 62 to be shifted independently of each other. For example, in some embodiments, assertion of the DQS signal 62 may be shifted (e.g., using one or more mode register settings) with respect to the DQ signal 61 but the DQ signal remains fixed based on read latency and burst length. Moreover, ends of the DQS RTT-OFF signal 80 and/or DQ RTT-OFF signal 82 may be independently shifted with respect to the respective DQ signal 61 and the DQS signal 62 using separate mode registers. Since DQS occurs during the entire READ operation 59, a DQS RTT-OFF signal 80 may be asserted for DQS only in a way similar to the DQS assertion of the RTT-OFF signal 60 of FIG. 2. When the DQS signal 62 is shifted, the DQS RTT-OFF signal 80 may be shifted and/or stretched accordingly. Since DQ may have ODT asserted/de-asserted separately for ODT assertion for DQS, DQ has a separate DQ RTT-OFF signal 82 that is asserted for some cycle-based delay 84 prior to the read period 58. The cycle-based delay 84 may be the same duration as the buffers 69 or a different duration. The DQ RTT-OFF signal 82 may utilize the same buffer 69 from the DQS end 66 to an end of the READ operation 59. The DQ RTT-OFF signal 82 includes a DQ RTT-OFF start 86 and a DQ RTT-OFF end 88. Similarly, the DQS RTT-OFF signal 82 includes a DQS RTT-OFF start 90 and a DQS RTT-OFF end 92. As illustrated, in some embodiments, the DQ RTT-OFF end 88 and the DQS RTT-OFF end 92 may occur at the same time (e.g., an end of the READ operation 59).

Figure 4:
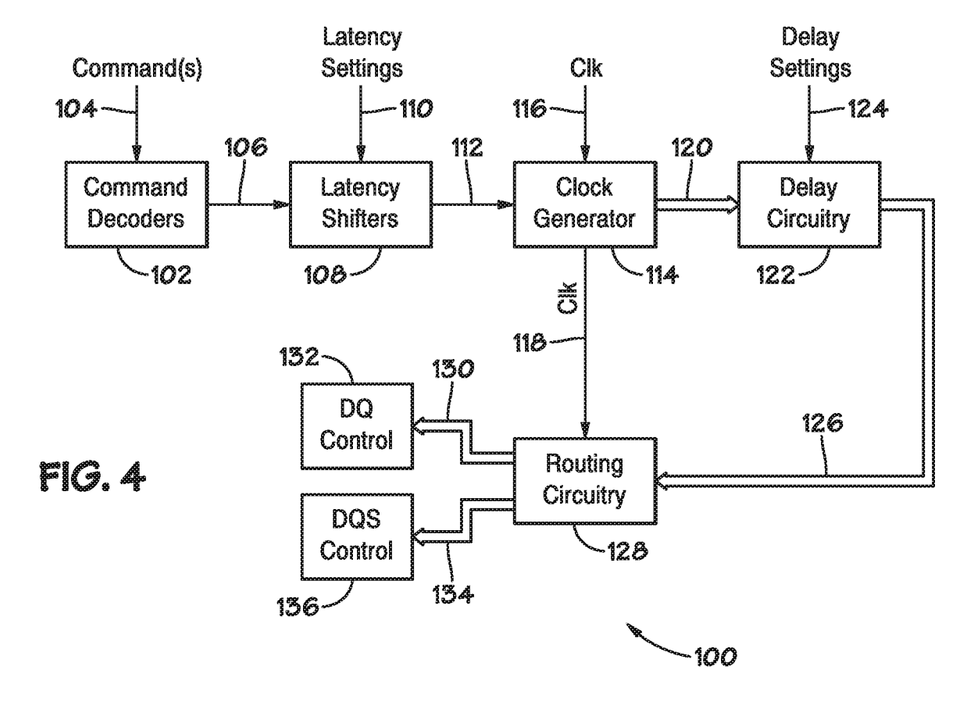
FIG. 4 is a block diagram of a pipeline used to provide an RTT architecture to enable DQS offsetting and/or to enable shifting of the RTT signals for DQ and/or for DQS, according to an embodiment of the present disclosure.

FIG. 4 illustrates a pipeline 100 used to provide an RTT architecture to enable DQS offsetting and/or to enable shifting of the RTT signals for DQ and/or for DQS. The pipeline 100 includes command decoders 102. For example, the command decoders 102 may include the command decoder 32 of FIG. 1. The command decoders 102 receive commands 104 to decode and decodes them. For example, the command decoders 102 may receive commands from the controller 17 through the command interface 14 (both illustrated in FIG. 1). Decoded commands 106 are then passed from the command decoders 102 to latency shifters 108. The latency shifters 108 may add some shifts or delays to the decoded commands 106 according to latency settings 110. The latency settings 110 may include certain settings such as a CAS latency (CL) and/or a CAS write latency (CWL) that may be set for the memory device 10.

The shifted commands 112 are then passed into a clock generator 114. The clock generator 114 may include any suitable mechanism for generating clock and/or cloning clocks from an input clock. For example, the clock generator 114 may include the internal clock generator 30 (e.g., delay lock loop) from FIG. 1. The clock generator 114 may receive and/or generate a clock 116. For example, the clock generator 114 may receive a system clock and/or any other clock such as the clock received from the command interface 14 by the internal clock generator 30. The clock generator 114 then passes a first clock 118 that may be the received clock 116 and/or a copy of the received clock 116. For instance, the clock generator 114 also generates additional cloned clocks 120 that are "clones" or copies of the received clock 116. These cloned clocks may be delay lines that are suitable for various creating and/or delaying operation signals such as a READ operation signal, an RTT write signal, an RTT non-targeted write signal, and/or an RTT non-targeted read signal.

These delay lines carrying cloned clocks 120 are passed into delay circuitry 122. The delay circuitry 122 may add additional shifts to the signals across the delay lines 120 based on delay settings 124 and/or other settings (e.g., latency settings 110). The delay circuitry 122 may include output enabling delays for QD (QED) and/or QDS (QES). For example, the delay circuitry 122 may include a chain of flip-flops that enable the delay circuitry to delay the incoming cloned clocks 120 based on the delay settings 124 and/or to add additional latency beyond that added in the latency shifters 108. For example, if a CL is set to a number (e.g., 20) of clock cycles, the delay circuitry 122 may count the number (e.g., 10) of clock cycles that have elapsed (e.g., at least partially due to the latency shifters 108). If the counted number of clock cycles does not meet the indicated number, the delay circuitry 122 may add an additional delay of a number (e.g., 10) of clock cycles to reach the target number. Furthermore, the delay circuitry 122 may add offset to the DQS and shifts of RTT for DQ and/or DQS by introducing additional delays using a delay pipeline (e.g., string of flip-flops) that may offset DQS and/or edges of RTT by utilizing mode registers that carry the delay settings 124 indicating how far to shift the DQS and/or edges of RTT signals.

The delay circuitry 122 generates and output signals 126 adjusted for the delays using the cloned clocks 120 and the delay settings 124 that are passed to the routing circuitry 128 via mode registers. Routing circuitry 128 receives the clock 118 and the signals 126 and passes them into routing paths that are then distributed to appropriate locations. For example, the routing circuitry 128 uses DQ-related traces 130 to pass DQ-related signals (e.g., RTT WR for DQ) of the signals 126 to a DQ control 132. The routing circuitry 128 may also use DQS-related trace 134 to route DQS-relates signals (e.g., RTT WR for DQS) to a DQS control 136. The DQ control 132 and the DQS control 136 may be used to control various aspects of the DQ and DQS, respectively. For example, each may be used to disable RTT on DQ and DQS, respectively, during a READ operation. Moreover, the DQS control 136 may be used to account for a read preamble that may affect the timing of the DQS signal.

Figure 5:
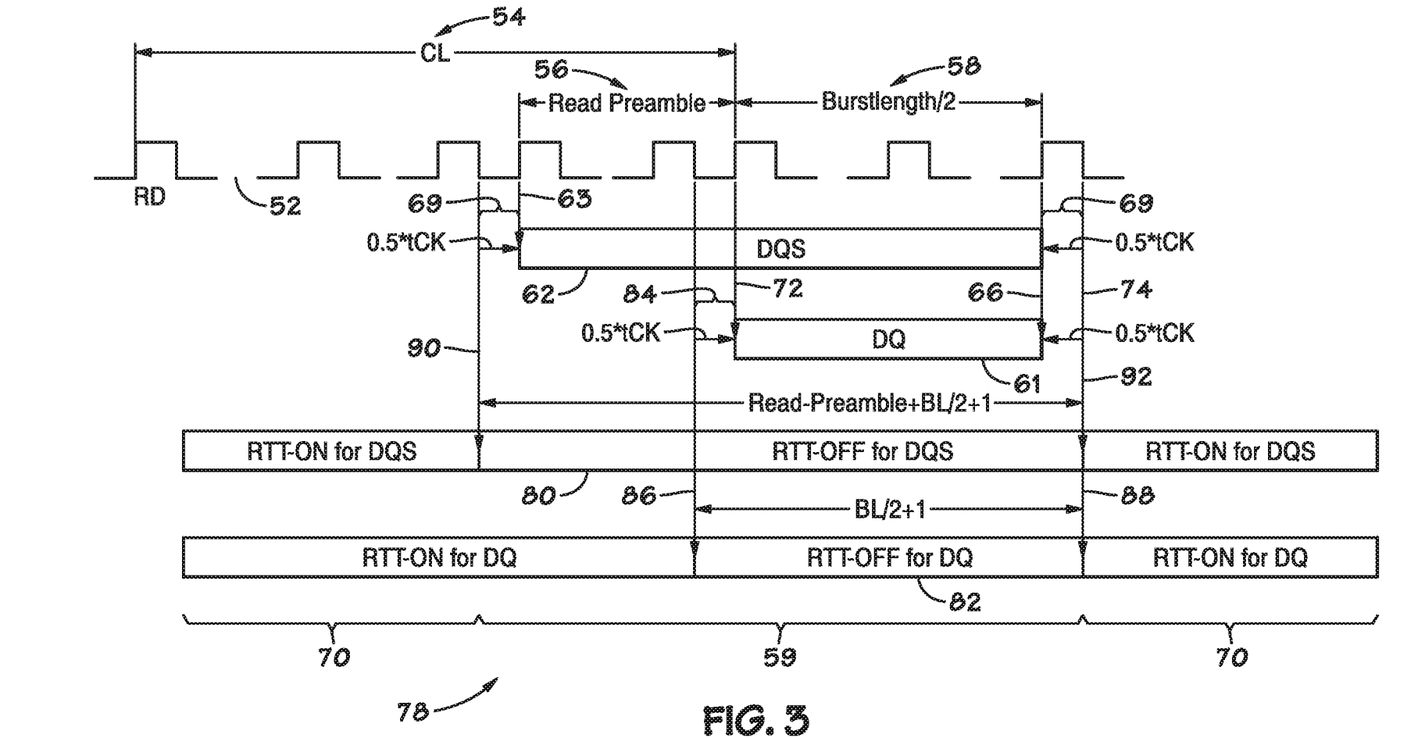
FIG. 5 is a block diagram of a pipeline used to provide an RTT architecture to enable DQS offsetting and/or to enable shifting of the RTT signals for DQ and/or for DQS, according to an embodiment of the present disclosure.

FIG. 5 illustrates a pipeline 150 that is an example embodiment of the pipeline 100. As illustrated, the pipeline 150 reflects an embodiment of the pipeline 100 that includes the commands 104 as a READ command, a WRITE command, a non-target (cancelled) READ command, and a non-target (cancelled) WRITE command. The command decoders 102 decode the commands 104 and pass them as decoded commands 106 to the latency shifters 108. As illustrated, the latency settings 110 include a CL setting for READ operations and used for RTT for non-targeted operations and include a CWL setting for WRITE operations and non-targeted operations. The shifted commands 112 are passed to the clock generator 114. As illustrated, the clock generator 114 may include a delay lock loop (DLL) that passes out a clock delay line 152. The clock delay line 152 may include a single delay line or may have separate delay lines, rising edge delay line 154 and a falling edge delay line 156. The clock generator 114 may also clone a number (e.g., 4) of cloned delay lines 114 that are passed to the delay circuitry 122 as cloned clocks 120. In some embodiments, all signals before the internal clock generator 114 may be in a clock domain, and all signals after the internal clock generator 114 may be in a DLL domain. As previously discussed, the delay circuitry 122 may provide output enabling delays for the DQ (QED) and/or the DQS (QES). The delay settings 124 may include a DQS offset in a mode register and/or RTT edge control settings in mode register(s).

The delay settings 124 are then used by the delay circuitry to offset the DQS signal and/or shifting edges of RTT for DQ and/or DQS. Moreover, as previously noted, the delay circuitry 122 may include a delay chain 159 that delays signals according to the delay settings 124. The delay chain 159 may include a string of flip-flops that may delay signals by a number of clock cycles based on a number of flip-flops through which the signals pass. Furthermore, in some embodiments, a default position may be delayed a number of times through the delay chain to enable shifts of the signals in either direction relative to the default location. In other words, when a default position is delayed a number of times (e.g., maximum number of shifts in an earlier direction), any signal that is delayed fewer times than the default location occurs earlier than the default location. Similarly, any signal that is delayed more times than the default location occurs after the default location. The shifted output signals 126 are then passed through appropriate routes. For example, in some embodiments, each signal type may have a dedicated route that is sent individually. In some embodiments, signal types (e.g., READ operation and WRITE operation) may share a common route. However, using a single route for multiple operation types may cause the memory device 10 to include additional multiplexers in the pipeline 150 that may increase delays through the pipeline 150 beyond target delays. Furthermore, consecutive signals (e.g., especially consecutive READs and WRITE operations) utilize some period of time between operations on a delay line to prevent conflict between consecutive signals (e.g., conflict between consecutive READ and WRITE operations). When different signals use different lines, the periods of time may more easily occur on respective delay lines. In other words, dedicated delay lines may provide more timing flexibilities for operations since there are fewer demands on each delay line. In some embodiments, each possible control signal may have its own delay line.

As illustrated, control signals 126 related to RTT edge control may be generated in RTT-edge control circuitry 160 for a first set of operations (e.g., targeted and/or non-targeted WRITE operations and/or non-targeted READ operations). The RTT-edge control circuitry 160 may shift RTT edges based on the delay settings 124. The RTT-edge control circuitry 160 generates signals over six traces: RTT WR DQ 162 for RTT control during a WRITE for DQ, RTT WR DQS 164 for RTT control during a WRITE for DQS, RTT WR NOM 166 for RTT control during a non-targeted WRITE operation for DQ, RTT WR NOM 168 for RTT control during a non-targeted WRITE operation for DQS, RTT RD NOM 170 for RTT control during a non-targeted READ operation for DQ, and RTT RD NOM 172 for RTT control during a non-targeted READ operation for DQS. In some of these embodiments, some traces may be used for more than a single operation type. For example, in some embodiments, targeted and non-targeted WRITEs may share a common trace.

The control signals 126 related to DQS offsets, QED signals, QES signals, and/or RTT disables for targeted READ operations in a second RTT control 174. The illustrated second RTT control 174 generates four traces: QES 176 for DQS, QED 178 for DQ, RTT-disable 180 for DQ during a READ operation, and RTT-disable 182 for DQS during a READ operation. The signals 126 over the respective traces are routed via the routing circuitry 128 and routing trace 184 to DQ control 132 and/or the DQS control 136.

Figure 6:
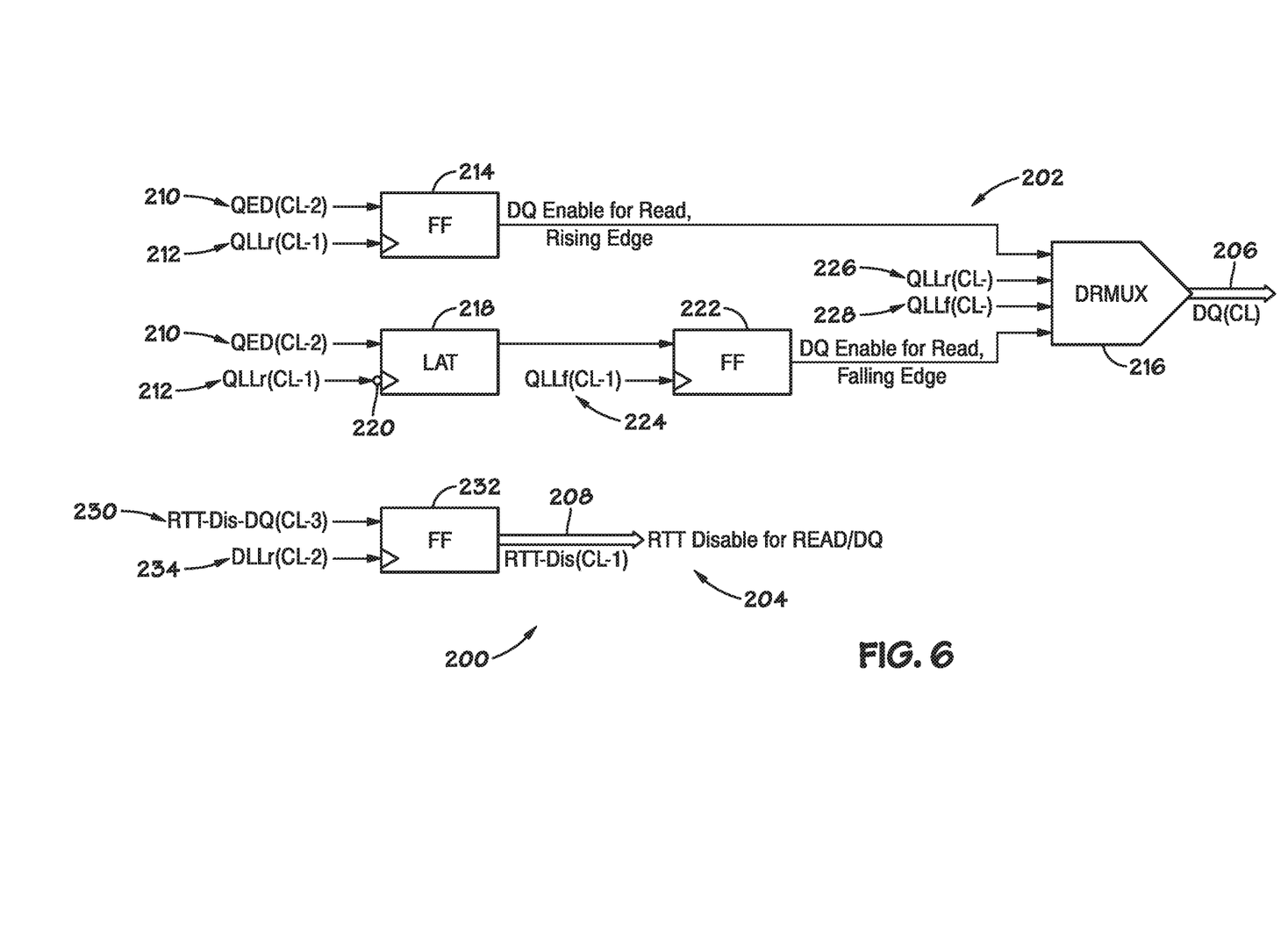
FIG. 6 is a schematic diagram of a DQ control that illustrates an embodiment of the DQ control used to implement the DQ and/or RTT signals of FIG. 4, according to embodiment of the present disclosure.

FIG. 6 illustrates a schematic diagram of a DQ control 200 that illustrates an embodiment of the DQ control 132. As illustrated, the DQ control 200 includes a DQ pipeline 202 and a RTT-disable pipeline 204. The DQ pipeline 202 outputs a DQ enable pulse 206 that is aligned to CL for enabling data on DQ during a READ operation. The RTT-disable pipeline 204 outputs an RTT-disable pulse 208 that disables RTT for the READ operations on DQ.

The DQ pipeline 202 utilizes rising and falling edges of the clock 118. For the rising edge, the DQ pipeline 202 receives QED(CL−2) 210 that is the QED signal having a total number of clock cycles in delays equal to two less than the CL for the memory device 10. The QED signal may have a pulse width equal to a half a burst length of the memory device 10 that is launched with DLLr(CL−2). The DQ pipeline 202 also receives a rising edge clock DLLr(CL−1) 212 that includes a rising edge of the clock generated in the clock generator 114 including a total number of clock cycles in delays equal to one less than the CL. These two signals 210 and 212 are passed to a flip-flop 214 that delays the QED(CL−2) 210 to generate a DQ enable aligned to DLLr(CL−1) 212. This DQ enable is then passed to a DRMUX 216 that outputs the DQ enable pulse 206.

For the falling edge, the DQ pipeline 202 receives QED(CL−2) 210 and the DLLr(CL−1) 212 into a latch 218 that is used to delay the QED(CL−2) 210 by a half-step by inverting the DLLr(CL−1) 212 using an inverter 220 to utilize a falling edge of the clock 118. In some embodiment, a falling edge clock may be received by the latch 218 rather than an inverting the DLLr(CL−1) 212. The half-step shifted QED(CL−2) 210 is passed to a flip-flop 222 that is used to align the QED to a falling edge DLLf(CL−1) 224 that corresponds to a falling edge that has a total number of clock cycles in delays equal to one less than CL. This aligned QED falling edge signal is passed to the DRMUX 216. Using the signals DLLr(CL) 226 and DLLf(CL) 228, the DRMUX 216 establishes rising and falling edges from the received QED signals to generate the DQ enable pulse 206. The DQ enable pulse 206 has a pulse width of half of the burst length of the memory device 10 and is launched with DLLr(CL) 226.

Similar to the DQ pipeline 202, the RTT-disable pipeline 204 receives an RTT-disable signal 230 for READ operations. The RTT-disable signal 230 is received with a number (e.g., 3) of clock cycles in delays before the CL has elapsed. For example, the RTT-disable signal 230 may have a pulse width of one more than half of a burst length of the memory device 10 and is received into the RTT-disable pipeline 204 with DLLr(CL−3). To control the timing of the RTT-disable signal 230, the RTT-disable pipeline 204 utilizes a flip-flop 232 that aligns the RTT-disable pipeline 204 to a rising edge of clock. For example, the RTT-disable pipeline 204 may be launched through the flip-flop 232 at a rising edge clock, e.g., DLLr(CL−2) 234, delayed a number (e.g., two) clock cycles less than CL to ensure that the RTT is disabled in the RTT-disable pulse 208 occurs before DQ is asserted using the DQ enable pulse 206 to prevent interference of ODT with DQ operation during a READ operation. The RTT-disable pulse 208 may have a pulse width of one more than half of a burst length of the memory device 10 and is launched with DLLr(CL−1) 212.

Figure 7:
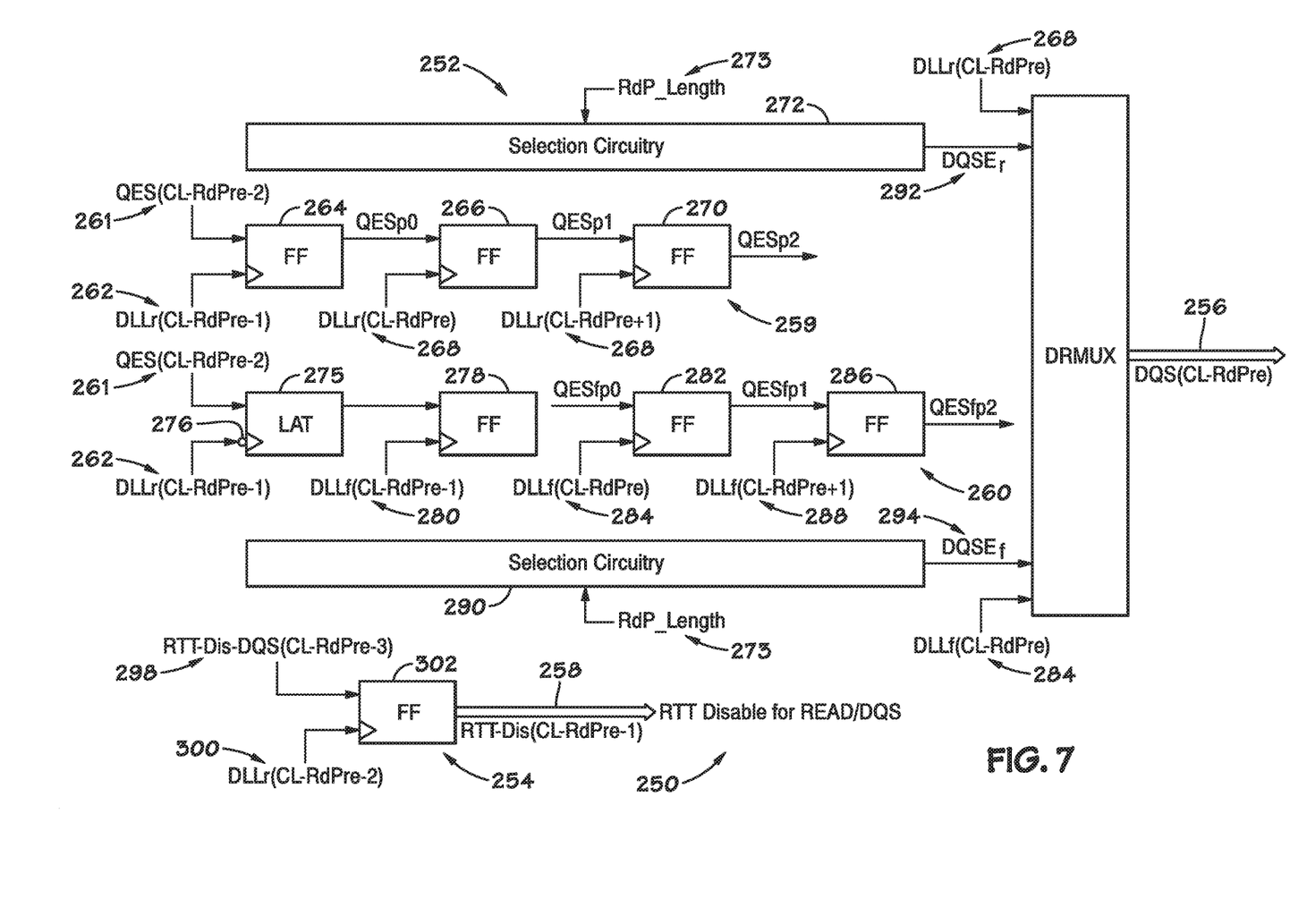
FIG. 7 is a schematic diagram of a DQS control that illustrates an embodiment of the DQS control used to implement the DQS and/or RTT signals of FIG. 4, according to an embodiment of the present disclosure.

FIG. 7 illustrates a DQS control 250 that is similar to the DQ control 200. In some embodiments, the DQS control 250 may be an embodiment of the DQS control 136. The DQS control 250 includes a DQS pipeline 252 and a RTT-disable pipeline 254. The DQS pipeline 252 outputs a DQS enable signal 256 that enables DQS usage for a READ operation. The RTT-disable pipeline 254 outputs an RTT-disable pulse 258 that is used to disable RTT for DQS during a READ operation.

The DQS pipeline 252 may be split into a rising edge pipeline 259 and a falling edge pipeline 260 that are independently used to generate a rising edge and falling edge for the DQS enable signal 256, respectively. The rising edge pipeline 259 receives a QES pulse launched some number less than CL and compensates for a maximum number (e.g., 2) of clock cycles that may occur during a preamble. For example, the QES pulse may be QES(CL−RdPre−2) 261. The QES pulse may have a pulse width that is half of a burst length of the memory device 10 that is launched at a time (e.g., readpreamble maximum and one less than number of flip-flops in the rising edge pipeline 259) earlier than CL. The rising edge pipeline 259 uses DLLr(CL−RdPre−1) 262 to launch the QED pulse through a flip-flop 264 to generate QESp0. QESp0 is then launched through a flip-flop 266 by a next clock cycle (e.g., DLLr(CL−RdPre) 268) that is used to generate QESp1 as a delayed version of QESp0. Similarly, QESp1 is used to generate QESp2 launching QESp1 through a flip-flop 270 using a next clock cycle (e.g., DLLr(CL−RdPre+1) 271).

Selection circuitry 272 then selects between QESp0, QESp1, and QESp2 based on a length of a read preamble. For example, if a read preamble length 273 has a first length (e.g., 1), the selection circuitry 272 combines QESp0 and QESp1. Combination of the QESp0 and QESp1 pulses may be combined using an OR gate since the pulses overlap. Thus, the combined pulses result in a length that is half of a burst length of the memory device 10 plus the delay (e.g., 1 clock cycle) from QESp0 to QESp1. However, if a read preamble length 273 has a second length (e.g., 2), the selection circuitry 272 combines QESp0, QESp1, and QESp2. Since these pulses overlap, they may be combined using an OR gate. Thus, the combined pulses result in a length that is half of a burst length of the memory device 10 plus the delay (e.g., 2 clock cycle) from QESp0 to QESp2.

The falling edge pipeline 260 receives a QES pulse launched some number less than CL and compensates for a maximum number (e.g., 2) of clock cycles that may occur during a preamble. For example, the QES pulse may be QES(CL−RdPre−2) 261. The QES pulse may have a pulse width that is half of a burst length of the memory device 10 that is launched at a time (e.g., readpreamble maximum and one less than number of flip-flops in the falling edge pipeline 260) earlier than CL. To align the QES pulse to the falling edge, a latch 275 may be used to shift the QES pulse by half a clock cycle by inverting the DLLr(CL−RdPre−1) 262 using an inverter 276. In some embodiments, the falling edge DLLf(CL−RdPre−1) may be passed into the falling edge pipeline 260 directly.

The QES pulse after shifting results in a half-step-shifted QES pulse that passed into a flip-flop 278 that is used to launch the shifted QES pulse with DLLf(CL−RdPre−1) 280 to form QESfp0. QESfp0 is passed into a flip-flop 282 that is used to launch QESfp0 with DLLf(CL−RdPre) 284 to form QESfp1. QESfp1 is passed into a flip-flop 286 that is used to launch QESfp1 with DLLf(CL−RdPre) 288 to form QESfp2.

Selection circuitry 290 then selects between QESfp0, QESfp1, and QESfp2 based on a length of a read preamble. For example, if a read preamble length 273 has a first length (e.g., 1), the selection circuitry 290 combines QESfp0 and QESfp1. Combination of the QESfp0 and QESfp1 pulses may be combined using an OR gate since the pulses over the lap. Thus, the combined pulses result in a length that is half of a burst length of the memory device 10 plus the delay (e.g., 1 clock cycle) from QESfp0 to QESfp1. However, if a read preamble length 273 has a second length (e.g., 2), the selection circuitry 290 combines QESfp0, QESfp1, and QESfp2. Since these pulses overlap, they may be combined using an OR gate. Thus, the combined pulses result in a length that is half of a burst length of the memory device 10 plus the delay (e.g., 2 clock cycle) from QESfp0 to QESfp2.

The selection circuitry 272 generates a DQS enable for the rising edge (DQSE$_r$) 292, and the selection circuitry 290 generates a DQS enable for the falling edge (DQSE$_r$) 294 that are both passed to a multiplexer 296 that controls output (e.g., based on a selection signal) of the DQS enable signal 256.

Similar to the DQS pipeline 252, the RTT-disable pipeline 254 receives an RTT-disable signal 298 for READ operations. The RTT-disable signal 298 is received with a number (e.g., 3) of clock cycles in delays remaining before CL has expired. For example, the RTT-disable signal 298 may have a pulse width of one more than half of a burst length of the memory device 10 and is received into the RTT-disable pipeline 254 with DLLr(CL−3). To control the timing of the RTT-disable signal 298, the RTT-disable pipeline 254 utilizes a flip-flop 302 that aligns the RTT-disable pipeline 254 to a rising edge of clock. For example, the RTT-disable pipeline 254 may be launched through the flip-flop 302 at a rising edge clock, e.g., DLLr(CL−2) 300, delayed a number (e.g., two) clock cycles less than CL to ensure that the RTT is disabled in the RTT-disable pulse 258 occurs before DQS is asserted using the DQS enable signal 256 to prevent interference of ODT with DQS operation during a READ operation. The RTT-disable pulse 258 may have a pulse width of one more than half of a burst length of the memory device 10 and is launched with DLLr(CL−1) 212.

Figure 8:
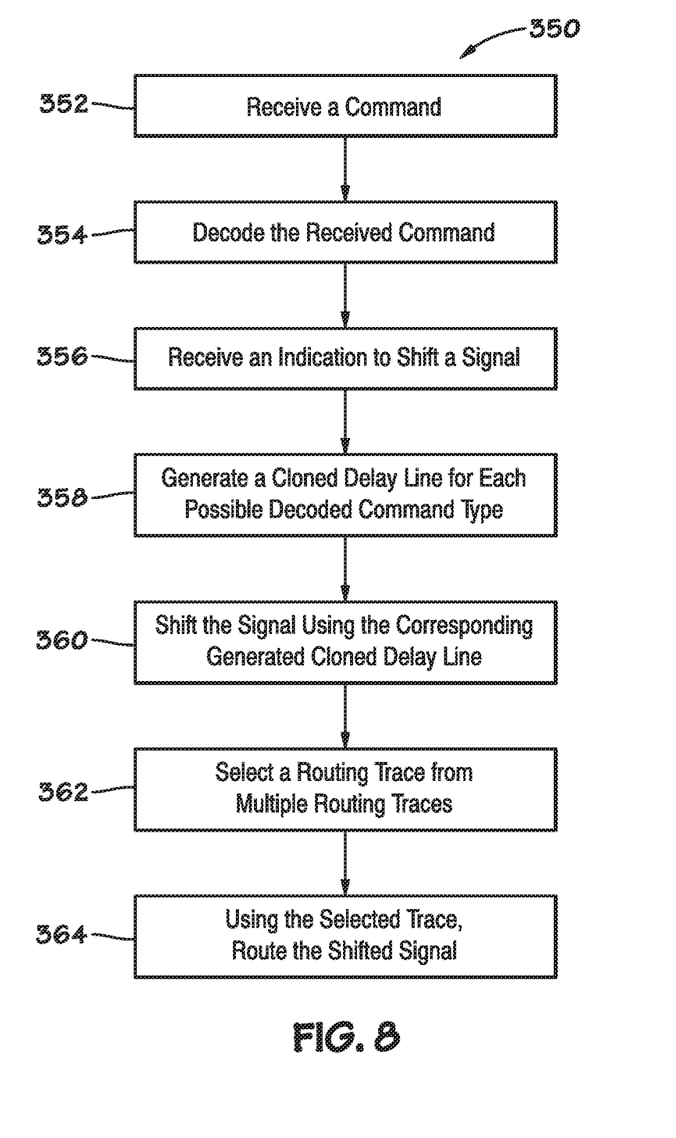
FIG. 8 is a block diagram of a process for shifting and routing signals related to a READ operation of the memory device of FIG. 1, according to an embodiment of the present disclosure.

FIG. 8 is a flowchart of a process 350 for utilizing the memory device 10 to shift signals based on incoming commands. The memory device 10 receives a command (block 352). For example, the command may be received via the command interface 14. Command decoders 102 decode the received command (block 354). The memory device 10 receives an indication to shift a signal corresponding to the command (block 356). For example, delay circuitry 122 may receive an indication (e.g., delay settings 124) that indicates that DQS is to be offset, a rising edge of RTT for DQ and/or DQS is to be shifted, and/or a falling edge RTT for DQ and/or DQS is to be shifted. A clock generator 114 generates a cloned delay line for each possible decoded command type (block 358). Using the corresponding generated cloned delay line, delay circuitry 122 shifts a corresponding signal (block 360). For example, the shifted signal may include offsetting DQS, shifting a rising edge of RTT for DQ and/or DQS, and/or shifting a falling edge of RTT for DQ and/or DQS. The delay circuitry 122 then selects a routing trace from multiple traces, where each of the multiple traces is dedicated to a decoded command type and a target control (e.g., DQ control 132 or DQS control 136). Using the selected trace routing circuitry 128 routes the shifted signal to the target control.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
 a command interface configured to receive a command for an operation of the semiconductor device;
 control circuitry configured to implement the command; and
 a routing pipeline configured to translate and route the command from the command interface to the control circuitry, wherein the routing pipeline comprises:
  clock circuitry comprising:
   a clock delay line; and
   a plurality of cloned delay lines derived from the clock delay line, wherein each of the plurality of cloned delay lines are dedicated to a command type of a plurality of command types; and
  delay circuitry configured to utilize the cloned delay lines to shift a data pin signal of the semiconductor device or shift a data strobe pin signal of the semiconductor device.

2. The semiconductor device of claim 1 comprising routing circuitry comprising a plurality of traces configured to route the command from the delay circuitry to the control circuitry.

3. The semiconductor device of claim 2, wherein each trace of the plurality of traces is dedicated to a specific command type and a pin type for the control circuitry.

4. The semiconductor device of claim 3, wherein the pin type for the control circuitry comprises a data pin type or a data strobe type.

5. The semiconductor device of claim 1, wherein shifting the data pin signal comprises shifting a rising edge of an on-die termination signal (RTT) for a data pin or shifting a falling edge of the RTT for the data pin.

6. The semiconductor device of claim 1, wherein shifting the data strobe pin signal comprises offsetting a data strobe (DQS) signal relative to a data (DQ) signal, shifting a rising edge of an on-die termination signal (RTT) for a data strobe pin, or shifting a falling edge of the RTT for the data strobe pin.

7. The semiconductor device of claim 1, comprising a shift mode register that controls shifting of the data pin signal or the data strobe pin signal in the delay circuitry.

8. The semiconductor device of claim 1, wherein the control circuitry comprises data (DQ) control circuitry comprising:
 a DQ pipeline configured to output a DQ enable signal aligned to a CAS latency for the semiconductor device; and
 an on-die termination (RTT) pipeline configured to output an RTT signal that occurs prior to the DQ enable signal.

9. The semiconductor device of claim 8, wherein the RTT signal comprises an RTT disable for a READ on a data pin.

10. The semiconductor device of claim 1, wherein the control circuitry comprises data strobe (DQS) control circuitry comprising:

a DQS pipeline configured to output a DQS enable signal aligned to a CAS latency minus a read preamble for a READ operation; and an on-die termination (RTT) pipeline configured to output an RTT signal that occurs prior to the DQS enable signal.

11. The semiconductor device of claim 10, wherein the RTT signal comprises an RTT disable for the READ operation on a data strobe pin.

12. The semiconductor device of claim 10, wherein the DQS pipeline comprises:
a first selection circuitry configured to output a rising edge of the DQS enable signal; and
a second selection circuitry configured to output a falling edge of the DQS enable signal.

13. The semiconductor device of claim 12, wherein the first selection circuitry is configured to output the rising edge of the DQS enable signal by:
receiving a read preamble length; and
combining a plurality of delayed signals through the DQS pipeline based at least in part on the received read preamble length.

14. The semiconductor device of claim 13, wherein the plurality of delayed signals are generated using a plurality of flip flops.

15. The semiconductor device of claim 12, wherein the second selection circuitry is configured to output the falling edge of the DQS enable signal by:
receiving a read preamble length; and
combining a plurality of delayed signals through the DQS pipeline based at least in part on the received read preamble length.

16. The semiconductor device of claim 15, wherein the plurality of delayed signals are generated using a plurality of flip flops.

17. The semiconductor device of claim 1, wherein the plurality of command types comprises a READ command type, an on-die termination (RTT) for a canceled READ command type, an RTT for a WRITE command type, and an RTT for a canceled WRITE command type.

18. A semiconductor device comprising:
a command decoder configured to decode a command, wherein the command comprises a READ command, a WRITE command, a cancelled READ command, or a cancelled WRITE command;
latency shifters configured to receive a CAS latency (CL) or a CAS write latency (CWL) and shift the decoded command;
a clock generator configured to clone a delay line for each possible decoded command type;
delay circuitry configured to utilize the cloned delay line to shift a data pin signal of the semiconductor device or shift a data strobe pin signal of the semiconductor device based at least in part on the decoded command; and
a plurality of traces configured to route the shifted data pin signal or the shifted data strobe pin signal to control circuitry, wherein each trace of the plurality of traces carries only a single control signal type.

19. The semiconductor device of claim 18, wherein the shifted data pin signal comprises a shifted rising edge or a shifted falling edge of an on-die termination (RTT) signal for a data pin; and the shifted data strobe pin signal comprises a shifted rising edge of an on-die termination (RTT) signal for a data strobe pin, a shifted falling edge of the RTT signal, or an offset of a data strobe signal (DQS) on the data strobe pin relative to a data signal (DQ) on the data pin.

20. The semiconductor device of claim 18 comprising the control circuitry, wherein the control circuitry comprises data (DQ) control circuitry comprising:
a DQ pipeline configured to output a DQ enable signal aligned to a CAS latency for the semiconductor device; and
an on-die termination (RTT) pipeline configured to output an RTT signal that occurs prior to the DQ enable signal.

21. The semiconductor device of claim 18 comprising the control circuitry, wherein the control circuitry comprises data strobe (DQS) control circuitry comprising:
a DQS pipeline configured to output a DQS enable signal aligned to a CAS latency minus a read preamble for a READ operation; and
an on-die termination (RTT) pipeline configured to output an RTT signal that occurs prior to the DQS enable signal.

22. The semiconductor device of claim 18, wherein the possible decoded command types comprise:
a READ command type;
a WRITE command type;
a cancelled READ type; and
a cancelled WRITE type.

23. A method, comprising:
receiving a command at a command interface of a semiconductor device;
decoding the received command at a command decoder of the semiconductor device;
receiving an indication to shift a signal corresponding to the command;
generating a cloned delay line for each possible decoded command type;
shifting the signal using the corresponding generated cloned delay line at delay circuitry of the semiconductor device;
selecting a routing trace from a plurality of routing traces, wherein each trace of the plurality of routing traces is dedicated to a corresponding command type of a plurality of possible incoming command types for the command and to a target control type of the semiconductor device, wherein the target control type comprises a data control or a data strobe control; and
using the selected trace, routing the shifted signal to the data control or to the data strobe control.

24. The method of claim 23, wherein shifting the signal comprises:
shifting a rising edge or a falling edge of an on-die termination (RTT) signal for a data pin of the semiconductor device;
shifting a rising edge or a falling edge of an RTT signal for a data strobe pin of the semiconductor device; or
offsetting a data strobe signal (DQS) on the data strobe pin relative to a data signal (DQ) on the data pin.

25. The method of claim 23, wherein the possible decoded command type comprises a READ operation, a WRITE operation, a cancelled READ operation, and a cancelled WRITE operation.

26. The method of claim 23, wherein the plurality of routing traces comprises:
an on-die termination (RTT) for a data pin for a WRITE operation trace;
an RTT for a data strobe pin for the WRITE operation trace;
an on-die termination (RTT) for the data pin for a non-target WRITE operation trace;
an RTT for the data strobe pin for the non-target WRITE operation trace;

an on-die termination (RTT) for the data pin for a non-target READ operation trace;
an RTT for the data strobe pin for the non-target READ operation trace;
an RTT-disable for the data pin trace; and
an RTT-disable for the data strobe pin trace.

\* \* \* \* \*